United States Patent [19]

Manning et al.

[11] Patent Number: 5,232,865
[45] Date of Patent: Aug. 3, 1993

[54] METHOD OF FABRICATING VERTICALLY INTEGRATED OXYGEN-IMPLANTED POLYSILICON RESISTOR

[75] Inventors: Monte Manning, Kuna; Roger Lee, Boise, both of Id.

[73] Assignee: Micron Technology, Inc., Boise, Id.

[21] Appl. No.: 915,067

[22] Filed: Jul. 15, 1992

Related U.S. Application Data

[62] Division of Ser. No. 734,922, Jul. 24, 1991, Pat. No. 5,159,430.

[51] Int. Cl.$^5$ ............... H01L 21/70; H01L 27/00
[52] U.S. Cl. ............... 437/60; 437/47; 437/193; 437/918; 148/DIG. 136; 257/350; 257/380
[58] Field of Search ............... 437/60, 228, 47, 193, 437/918; 357/63; 148/DIG. 136; 257/350

[56] References Cited

U.S. PATENT DOCUMENTS

| | | | |
|---|---|---|---|
| 4,406,051 | 9/1983 | Iisuka | 29/576 |
| 4,727,045 | 2/1988 | Cheung et al. | 437/47 |
| 4,755,865 | 7/1988 | Wilson et al. | 357/63 |
| 5,159,430 | 10/1992 | Manning et al. | 357/51 |

OTHER PUBLICATIONS

"A Novel Scaled-Down Oxygen-Implanted Polysilicon Resistor for Future Static RAM's [sic: RAMs]", R. Saito, et al, IEEE Transactions on Electron Devices vol. 35, No. 3, pp. 298-301, Mar. 1988.

"Thyristors with Polysilicon Shunt Resistors", R. A. Duclos, et al, RCA Technical Notes, No. 1365, Mar. 21, 1985.

"Oxygen Implantation for Polysilicon TCR Optimization", C. H. Lee, IBM Technical Disclosure Bulletin, vol. 24, No. 4, Sep. 1981.

"Oxygen effect on the electrical characteristics of polycrystalline silicon films", R. Angelucci, et al, Appl. Phys. Lett., vol. 39, No. 4, Aug. 15, 1981.

"An Advanced MOS-IC Process Technology Using Local Oxidation of Oxygen-Doped Polysilicon Films", T. Yamaguchi, et al, IEEE Journal of Solid-State Circuits, vol. SC-13, No. 4, Aug., 1978.

"A Wide Range Linear Variable Resistor by Buried Channel MOS/SIMOX", M. Akiya, IEEE Journal of Solid-State Circuits, vol. SC-19, No. 4, Aug. 1984.

*Primary Examiner*—Olik Chaudhuri
*Assistant Examiner*—H. Jey Tsai
*Attorney, Agent, or Firm*—William R. Bachand

[57] ABSTRACT

A method for fabricating a high value, vertically integrated resistor begins with an integrated circuit having an unpassivated upper surface that includes designated circuit nodes to be placed in series with the vertical resistor. A layer of passivating material such as borophospho silicate glass is deposited on the upper surface of the integrated circuit. Polysilicon vias are formed that extend through the passivating layer and form an electrical ohmic contact with each designated circuit node. The polysilicon vias are subsequently ion implanted with oxygen or nitrogen to increase the resistance thereof to the final desired resistance, which can be greater than 100 megohms, and as much as a gigohm or a terohm. Finally, the vertical resistor is contacted with a metal layer formed on the surface of the passivating layer.

7 Claims, 4 Drawing Sheets

METHOD OF FABRICATING VERTICALLY INTEGRATED OXYGEN-IMPLANTED POLYSILICON RESISTOR

This is division, of application Ser. No. 07/734,922, filed Jul. 24, 1991 and now U.S. Pat. No. 5,159,430.

BACKGROUND OF THE INVENTION

This invention pertains to integrated resistors, and more particularly to vertically integrated resistors having an extremely high resistance.

It is well known in integrated circuit design and manufacturing that it is difficult to fabricate high value resistors on the order of 100 megohms or more. Conventional integrated resistors such as diffused and thin film resistors do not generally have a high value of resistivity and are horizontally integrated with respect to the surface of the integrated circuit. Therefore, such conventional resistors require more die area than is practical for VLSI levels of integration.

The problem of fabricating high value resistors is especially noticeable in integrated memory arrays. A static RAM cell, for example, may contain two load resistors that each draw current from a power supply depending upon the cell state. Due to the large number of memory cells in the array, a low value load resistor causes excessive current flow into the chip, undesirably increasing power dissipation. For lower power dissipation and other factors such as high gain, it is highly desirable that each load resistor have a high resistance, on the order of 100 megohms or more. In certain applications, resistances on the order of a gigohm ($10^9$ohms) or even a terohm ($10^{12}$) may even be required. However, such high value load resistances are not conventionally integratable into a memory aray because of the excessive die area consumed.

Therefore, what is desired is a high value resistor that does not require excessive die area and can be practically fabricated in an integrated circuit process.

SUMMARY OF THE INVENTION

It is therefore an object of the present invention to provide a method of fabricating a high value resistor compatible with high density semiconductor integrated circuits.

It is an additional object of the present invention to provide a vertically integrated resistor in order to minimize or even eliminate additional die area.

It is a further object of the present invention to decrease the power dissipation and die area of a memory cell.

It is an advantage of the present invention that only one additional mask is necessary to practice the method of fabricating a high value resistor.

It is an additional advantage of the present invention that the high value resistor can contact N-type or P-type diffusions, as well as doped or undoped polysilicon regions.

According to the present invention, a method for fabricating a high value, vertically integrated resistor begins with an integrated circuit having an unpassivated upper surface that includes designated circuit nodes to be placed in series with the vertical resistor. A layer of passivating material such as borophospho silicate glass ("BPSG") is deposited on the upper surface of the integrated circuit. Polysilicon vias are formed that extend through the passivating layer and form an electrical ohmic contact with each designated circuit node. The polysilicon vias are subsequently ion implanted with oxygen or nitrogen to increase the resistance thereof to the final desired resistance, which can be greater than 100 megohms. The resistance can be increased with a stronger implant dose to the gigohm or terohm range. Finally, the vertical resistor is contacted with a metal layer formed on the surface of the passivating layer.

In the preferred method the polysilicon vias are formed by opening a contact window through the passivating layer above each designated circuit node, depositing a layer of polysilicon on the upper surface of the passivating layer such that the polysilicon layer completely fills each contact window, and stripping the polysilicon layer above the upper surface of the passivating layer, leaving the polysilicon in each contact window. The polysilicon vias are then doped by ion implanting the entire surface of the passivating layer with oxygen or nitrogen ions.

The foregoing and other objects, features and advantages of the present invention are more readily apparent from the following detailed description of a preferred embodiment that proceeds with reference to the drawings.

DETAILED DESCRIPTION

Figure 1:
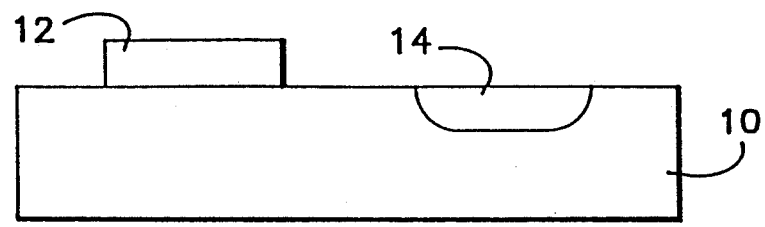
FIGS. 1-6 are sectional views of an integrated circuit that generally illustrate the method steps of fabricating a high value, vertically integrated resistor according to the present invention.
Figure 2:
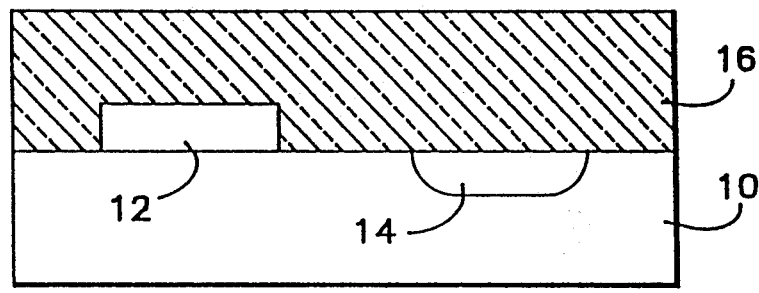

The method of forming a high value, vertically integrated resistor begins with an integrated circuit substrate 10 having an unpassivated upper surface as shown in FIG. 1. The substrate 10 can be either N-type or P-type silicon, or other starting material as is described in further detail below. Circuit nodes designated to be placed in series with the high value vertical resistor are illustrated by polysilicon layer 12 and diffused area 14. The diffused area 14 can also be N-type or P-type silicon. Although only two designated nodes are illustrated in FIG. 1, any number of circuit nodes on the integrated circuit substrate can be designated to be placed in series with the high value vertical resistor. As shown in FIG. 2, a layer of passivating material 16 such as doped or undoped silicon dioxide or silicon nitride or other conventional passivating materials is deposited on the upper surface of the integrated circuit substrate 10, coating the polysilicon layer 12 and the diffused area 14.

Figure 3:
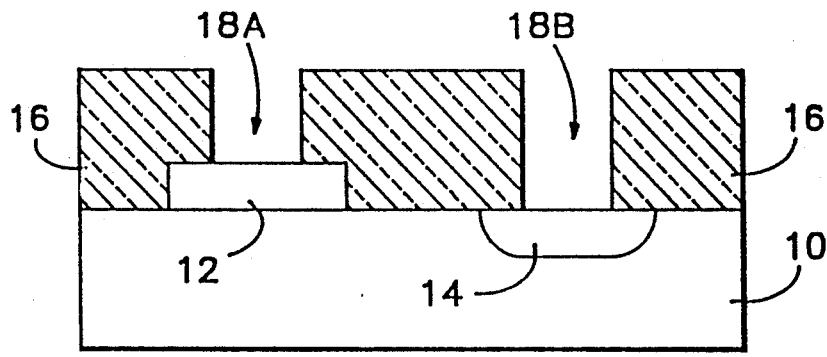
Figure 4:
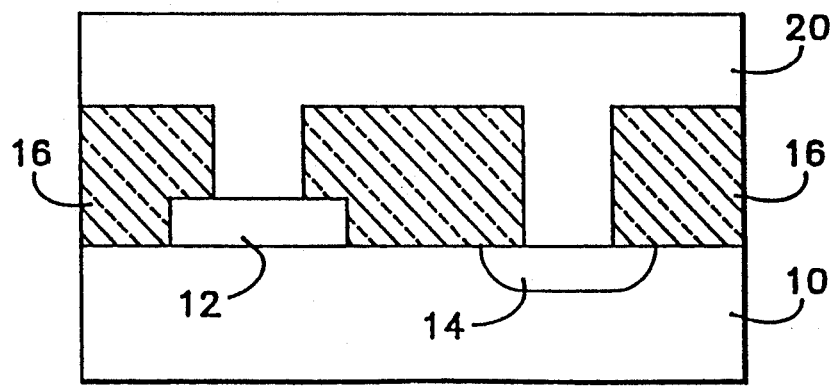
Figure 5:
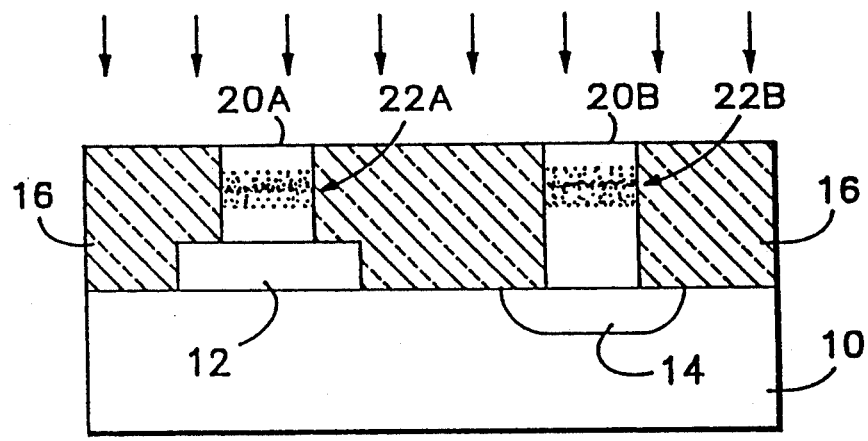

Once the passivating layer 16 has been deposited, polysilicon vias 20A and 20B (best seen in FIG. 5) are formed through the passivating layer 16. The polysilicon vias are in electrical, ohmic contact with the designated circuit nodes in the polysilicon layer 12 and the diffused area 14. Referring to FIG. 3, the polysilicon vias 20A and 20B are ideally formed by opening contact windows 18A and 18B through the passivating layer 16 above each designated circuit node. The contact windows 18A and 18B are etched into the passivating layer 16 with an etchant that preferentially etches the passivating layer 16 over the silicon found in the polysilicon layer 12 and the diffused area 14. Thus, the contact windows 18A and 18B stop when the designated circuit node is exposed. Referring to FIG. 4, a layer 20 of polysilicon is deposited on the upper surface of the passivating layer 16, which also completely fills each contact window 18A and 18B with polysilicon. Referring to FIG. 5, the polysilicon layer 20 above the upper surface of the passivating layer 16 is stripped using mechanical planarization or other means, leaving the polysilicon vias 20A and 20B in each contact window 18A and 18B. Polysilicon vias 20A and 20B are either undoped or lightly doped, if desired.

Once the polysilicon vias 20A and 20B are vertically integrated into the passivating layer 16, the high resistance is achieved through oxygen or nitrogen doping. As shown in FIG. 5, the entire surface of the passivating layer is ion implanted with either oxygen or nitrogen ions. The passivating layer 16 is not materially affected by the implanted oxygen or nitrogen ions. However, the polysilicon vias 20A and 20B form high resistance zones 22A and 22B. The dosage and energy of the oxygen or nitrogen implant determines the depth, profile, and vertical resistance of the high resistance zones 22A and 22B. The exact dosage and implant energy to achieve a desired value of resistance depends upon the semiconductor process and materials used. It is therefore desirable to characterize the vertical resistance in each process over a range of implant dosages and energies, including subsequent processing steps. The step of ion implanting the entire surface of the passivating layer 16 with oxygen or nitrogen ions is continued until the vertically integrated resistor achieves the final desired resistance value. The final resistance value can easily be greater than 100 megohms, and as great as gigohms or even terohms.

After the ion implantation step has been completed, an annealing step is performed, which defines and fixes the final shape and resistance of the high resistance zones 22A and 22B. Thus, the final vertical resistor includes upper and lower substantially undoped or lightly doped polysilicon regions 20A, and a central, oxygen or nitrogen doped high resistance region 22A.

Figure 6:
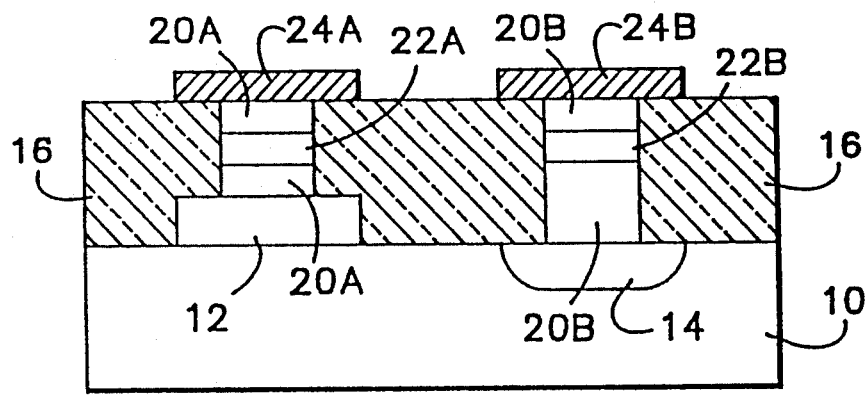

The vertical resistor is contacted by a metal layer formed on the upper surface of the passivating layer 16, shown in FIG. 6 as metal layer lines 24A and 24B. The metal layer forms an electrical, ohmic contact with the undoped upper region 20A of the vertical resistor. If desired, additional passivating and metal layers can be formed on top of passivating layer 16.

FIG. 6 therefore shows an integrated circuit including a silicon substrate 10 having an upper surface, a first contact node including a portion of a polysilicon interconnect layer 12 deposited above the upper surface of the silicon substrate, and a second contact node including a portion of a diffused area 14 in the silicon substrate. A passivating layer 16 covers the upper surface of the silicon substrate 10 and the first and second contact nodes. A first polysilicon via 20A extends completely through the passivating layer 16 to form an ohmic contact with the first contact node, and a second polysilicon via 20B extends completely through the passivating layer 16 to form an ohmic contact with the second contact node. The first and second polysilicon vias 20A and 20B each include a lower undoped region, a high resistivity oxygen or nitrogen doped region (22A and 22B, respectively) formed at the same vertical distance from the upper surface of the passivating layer 16 (which is also the upper surface of the polysilicon vias 20A and 20B), and an upper undoped region. FIG. 6 also shows a metal contact layer 24A, 24B formed on an upper surface of the passivating layer 16, the metal contact layer 24A, 24B being on ohmic contact with the upper undoped region of the first and second polysilicon vias 20A and 20B.

Thus, it is apparent that the process steps shown in FIGS. 1-6 result in a vertically integrated resistor requiring only one additional masking step. The additional masking step is required to mask out the contact windows 18A and 18B in FIG. 3. No mask is required for the ion implantation step since the oxygen or nitrogen doping is self-aligned by passivating layer 16. It is further apparent that die area is minimized since the resistance is developed vertically, as opposed to conventional, horizontally integrated resistors. Thus, the horizontal "footprint" of the vertical resistor can be made exceeding small, even to the limits of the available lithography tolerances, if desired. Generally, the horizontal area consumed by the resistor can be made as small as or smaller than the polysilicon layer 12 or diffused area 14 containing the designated circuit node. Furthermore, it has been shown that a doped or undoped polysilicon layer 12, as well as an N-type or P-type diffused region 14 can be used to combination with the vertical resistor of the present invention. However, some type of silicon material is desirably used to stop the preferential etch of the passivating layer 16.

Figure 7:
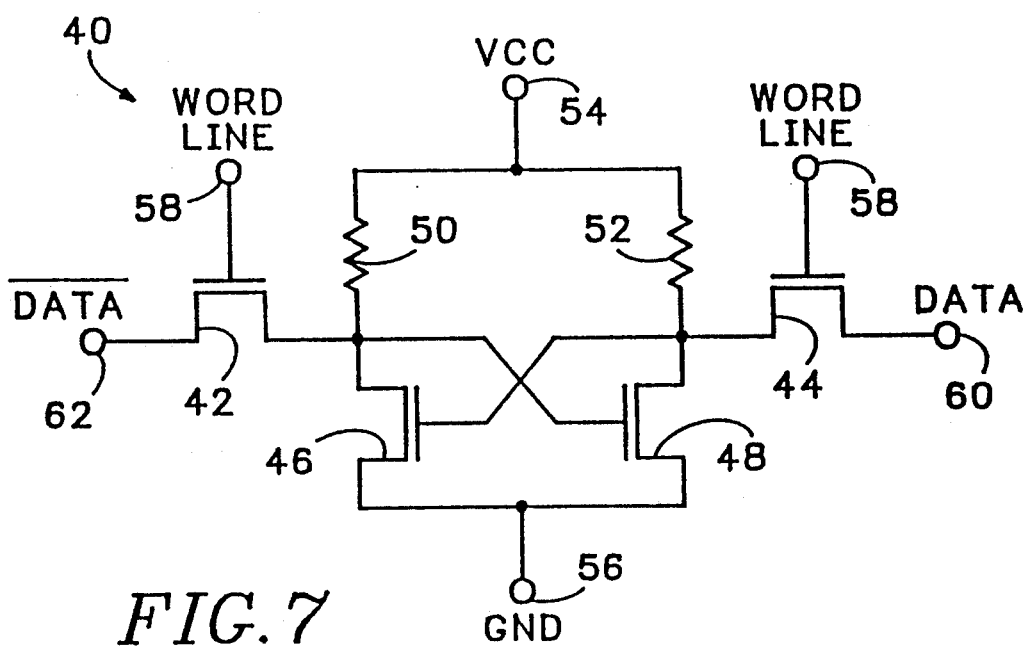
FIG. 7 is a schematic diagram of a static RAM ("SRAM") memory cell.

The vertical resistor described above is ideally suited for use in an integrated memory array containing thousands of memory cells. FIG. 7 shows a typical static RAM ("SRAM") cell 40 including two load resistors 50 and 52 coupled to the positive supply voltage, VCC, at terminal 54. Each load resistor 50 and 52 draws load current from VCC depending upon the polarity of the input DATA signal that determines the cell state. The SRAM cell includes crosscoupled transistors 46 and 48 for storing charge and pass transistors 42 and 44 for allowing reading and writing the digital input DATA signal on terminals 60 and 62. The read and write is controlled by word line signals at the coupled gates 58 of transistors 42 and 44. The transistor circuit including transistors 42-48 is coupled to ground or another supply voltage at terminal 56. Typically the voltage differential between terminals 54 and 56 is five volts, or 3.3 volts for highly integrated memory arrays. The drains of transistors 46 and 48 are load terminals for interconnection with load resistors 50 and 52.

The general process steps of FIGS. 1-6 are repeated in FIGS. 8-13, but specifically showing the details of an integrated load resistor connected to the drain of a pulldown transistor in an SRAM cell.

Figure 8:
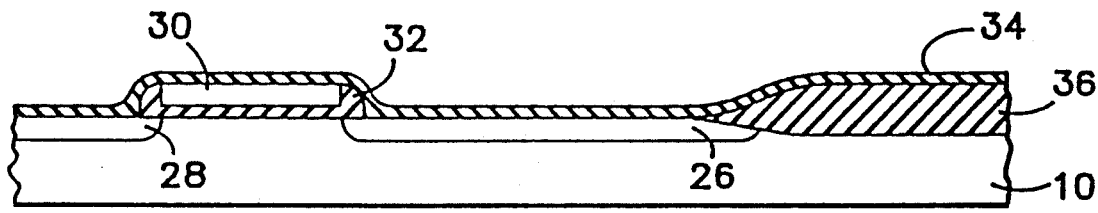
FIGS. 8-13 are sectional views corresponding to FIGS. 1-6 that specifically illustrate the method of fabricating a high value, vertically integrated load resistor for an SRAM memory cell.

FIG. 8 shows a section of one of the transistors of the SRAM cell 40. The starting substrate material is P-type silicon into which an N-type drain 26 and an N-type source 28 are diffused. A polysilicon gate 30 is separated from the channel area between the source 28 and drain 26 by a spacer oxide 32. A thin undoped TEOS (tetraethyl-ortho-silicate) oxide layer 34 conformally covers the surface of the transistor. The transistor is isolated from other active devices by thick field oxide 36. The designated circuit node for contact with the vertical resistor is diffused drain 26.

Figure 9:
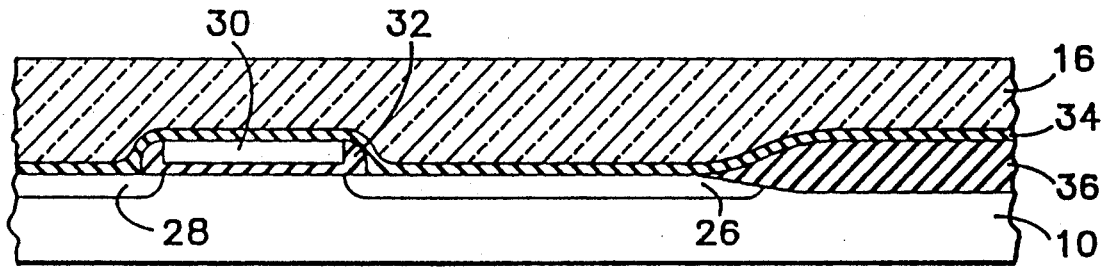

FIG. 9 shows the passivating layer 16, which is ideally a planarized layer of boro-phospho silicate glass ("BPSG") or other heavily doped oxide. The planarization of the BPSG can be accomplished by either mechanical or chemical means as is known in the art. The heavily doped BPSG is preferred because the uniformity and reflow characteristics of the passivating layer 16 are improved, and mobile ion contaminants such as sodium and potassium in the substrate 10 are gettered into the passivating layer 16. The BPSG passivating layer 16 also prevents mobile ion contamination from reaching the substrate during subsequent processing steps. The BPSG passivating layer 16 is desirably deposited to a thickness of about one micron.

Figure 10:
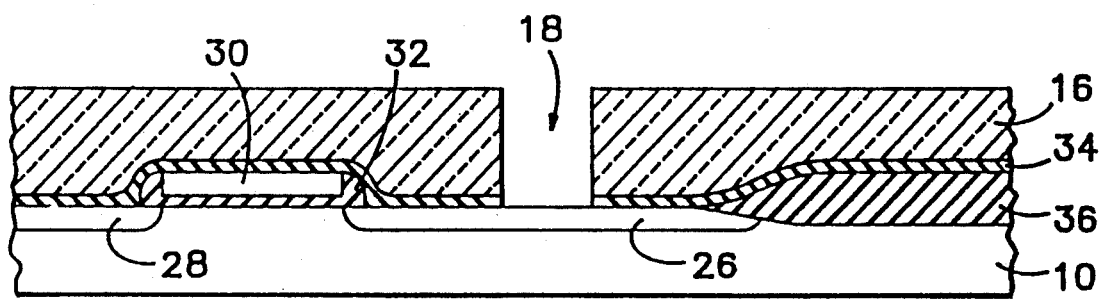

FIG. 10 shows the contact window 18 formed into the BPSG passivating layer 16 after a masking step. The contact window 18 is formed with a reactive ion etch ("RIE") or other anisotropic etch. The etch is desirably made to preferentially etch the BPSG passivating layer over the silicon substrate 10 and diffused drain 26. Note that the contact window is etched through the passivating layer 16 and the TEOS layer 34, and stops at the surface of the diffused drain 26.

Figure 11:
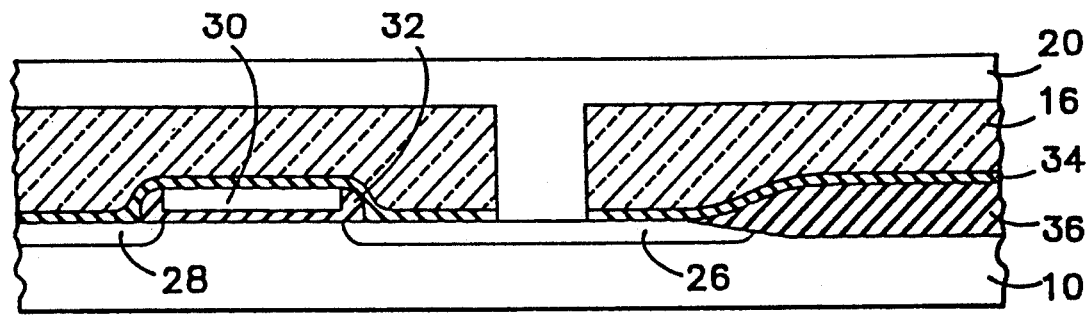

FIG. 11 shows the deposition of the polysilicon layer 20. The polysilicon can be undoped or lightly doped. For the contact window 18 to be completely filled with polysilicon, it is desirable that the polysilicon layer 20 be at least as thick as the radius of the horizontal "footprint" of the contact window 18. For example, if the mask is patterned with one micron circles wherever a vertical resistor is desired, the polysilicon layer should be made about 6000 Angstroms thick to ensure that each contact window 18 is completely filled with polysilicon.

Figure 12:
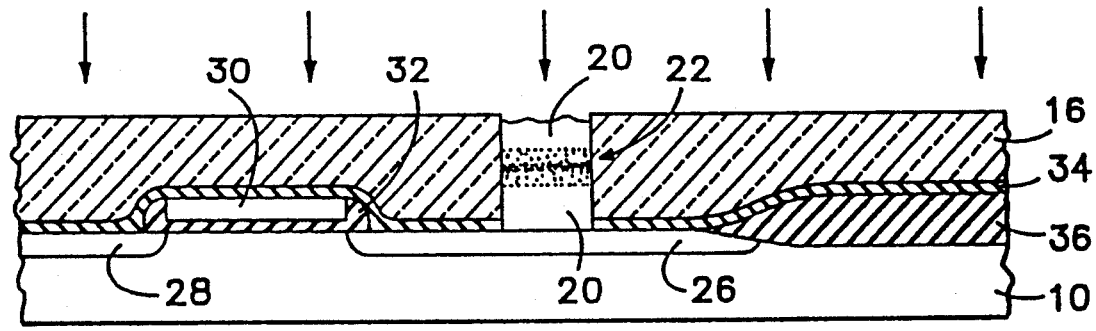

FIG. 12 shows that the polysilicon layer 20 is etched back to the surface of the passivating layer 16, leaving the polysilicon via 20. The etching step is a blanket etch back, which can be accomplished by an RIE, plasma, or chemical etch, or by a mechanical process such as polishing. FIG. 12 also shows the ion implantation of the entire surface of the passivating layer, which produces the high resistivity zone 22. For the load resistor 50 and 52 of the SRAM cell, assume a vertical resistor with a horizontal diameter of about a micron, and a vertical length of about a micron. Thus, an implant dose of $10^{17}$ at an energy of 100 KeV produces a high resistance zone about 0.2 microns from the surface of the polysilicon via 20 and a corresponding resistance of about 200 gigohms ohms. The ion implantation step can damage the surface of the polysilicon via 20, but any surface damage does not substantially affect the resistance of the vertical resistor.

The entire integrated circuit is subsequently annealed at a temperature of 950 degrees Celsius for ten minutes. The anneal process fixes and stabilizes the value of the vertical resistor. During the anneal process, the drain 28 out-diffuses into the lower undoped portion of the polysilicon 20. Again, the out-diffusion does not substantially affect the resistance of the vertical resistor or otherwise impact the performance of the memory cell 40.

Figure 13:
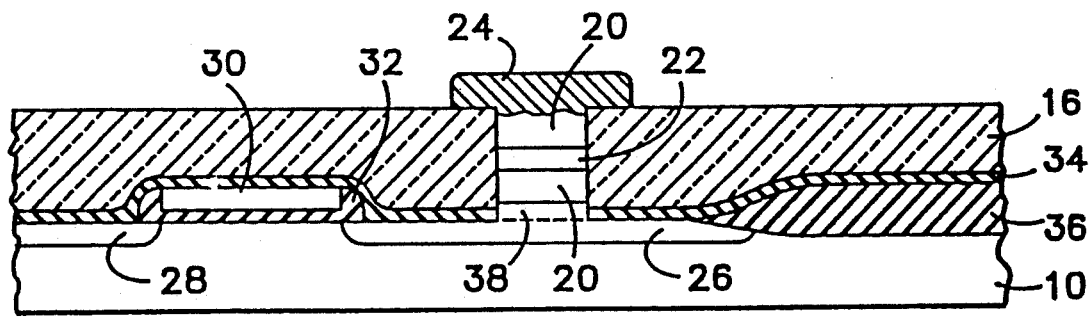

FIG. 13 shows the final metallization step in which all normal circuit contacts, as well as the vertical resistor contacts are metallized. The contact for the vertical load resistor is shown as metal segment 24.

It has been shown that an extremely high value vertical resistor can be vertically integrated into a memory cell, thus decreasing power dissipation while minimizing or eliminating the need for additional die area. The vertical resistor has been shown to have a range of possible resistance values from slightly greater than the resistance of the undoped or lightly doped polysilicon vias up to several terohms.

Having illustrated and described the principles of my invention in a preferred embodiment thereof, it is apparent to those skilled in the art that the invention can be modified in arrangement and detail without departing from such principles. We claim all modifications coming within the spirit and scope of the accompanying claims.

We claim:

1. A method of forming a vertically integrated resistor in series with a designated circuit node of an integrated circuit, the method comprising the steps of:

forming an integrated circuit having an upper surface including the designated circuit node;

depositing a layer of passivating material on the upper surface of the integrated circuit;

forming a polysilicon via through the passivating layer, the via electrically coupled to the designated circuit node; and forming a stratified layer within the polysilicon via by doping the polysilicon via with at least one of oxygen and nitrogen thereby increasing the resistance of the polysilicon via.

2. A method of forming a vertically integrated resistor as in claim 1 in which the step of forming a polysilicon via comprises:

removing a portion of the passivating layer to expose the designated circuit node;

forming a layer of polysilicon on the passivating layer, the polysilicon layer having a first portion covering the designated circuit node and a second portion covering a portion of the passivating layer; and stripping the second portion of the polysilicon layer.

3. A method of forming a vertically integrated resistor as in claim 1 in which the step of forming a stratified layer is continued until the resistance of the polysilicon via is greater than 100 megohms.

4. A method of forming a vertically integrated resistor as in claim 1 further comprising the steps of:

forming a metal layer on the passivating layer, the metal layer electrically coupled to the polysilicon via.

5. A method of forming an integrated circuit, the method comprising the steps of:

forming a circuit on a substrate, the circuit having a designated circuit node;

forming a passivating layer on the circuit, the passivating layer having a contact window that exposes the designated circuit node;

covering the designated circuit node with a layer of polysilicon;

forming a stratified layer within the layer of polysilicon thereby increasing the resistance of the layer of polysilicon to current flow substantially perpendicular to the stratified layer.

6. The method of claim 5 wherein the circuit is a memory cell.

7. The method of claim 5 further comprising the step of:

forming a conductive layer on the layer of polysilicon, the conductive layer electrically coupled to the layer of polysilicon.

* * * * *